United States Patent
Sahner et al.

(10) Patent No.: US 9,709,455 B2
(45) Date of Patent: Jul. 18, 2017

(54) METHOD AND DEVICE FOR LOCALIZING A DEFECT IN AN ELECTROCHEMICAL STORE AND DEFECT LOCALIZATION SYSTEM

(71) Applicant: Robert Bosch GmbH, Stuttgart (DE)

(72) Inventors: Kathy Sahner, Mannheim (DE); Jens Grimminger, Leonberg (DE); Dirk Liemersdorf, Sachsenheim (DE)

(73) Assignee: Robert Bosch GmbH, Stuttgart (DE)

( * ) Notice: Subject to any disclaimer, the term of this patent is extended or adjusted under 35 U.S.C. 154(b) by 150 days.

(21) Appl. No.: 14/394,334

(22) PCT Filed: Mar. 7, 2013

(86) PCT No.: PCT/EP2013/054639
§ 371 (c)(1),
(2) Date: Oct. 14, 2014

(87) PCT Pub. No.: WO2013/152907
PCT Pub. Date: Oct. 17, 2013

(65) Prior Publication Data
US 2015/0090009 A1 Apr. 2, 2015

(30) Foreign Application Priority Data
Apr. 12, 2012 (DE) .................. 10 2012 205 928

(51) Int. Cl.
*G01M 3/00* (2006.01)
*H01M 10/42* (2006.01)
(Continued)

(52) U.S. Cl.
CPC ............. *G01M 3/002* (2013.01); *G01R 31/36* (2013.01); *H01M 10/4207* (2013.01);
(Continued)

(58) Field of Classification Search
CPC .................... G01M 3/002; H01M 10/4228
See application file for complete search history.

(56) References Cited

U.S. PATENT DOCUMENTS 4,443,402 A * 4/1984 Marini .................. G21C 17/07
376/252
7,597,977 B2 * 10/2009 Hamada ............ H01M 8/04007
320/101
(Continued)

FOREIGN PATENT DOCUMENTS

CN 1738073 A 2/2006
CN 1794512 A 6/2006
(Continued)

OTHER PUBLICATIONS

International Search Report for PCT/EP2013/054639, issued on Jun. 26, 2013.

*Primary Examiner* — Ryan Walsh
(74) *Attorney, Agent, or Firm* — Norton Rose Fulbright US LLP; Gerard Messina

(57) ABSTRACT

The invention relates to a method for localizing a defect in an electrochemical store (165). The method includes a step of controlling the temperature of a subarea (145, 150, 155, 160, 170) of the electrochemical store (165) to increase an internal pressure of the subarea (145, 150, 155, 160, 170), a step of detecting a measured value which represents an escape of a component from the subarea (145, 150, 155, 160, 170) occurring in response to the increased internal pressure of the subarea (145, 150, 155, 160, 170), and a step of localizing the defect in the subarea (145, 150, 155, 160, 170) when the measured value is in a predetermined relation to a comparison value.

4 Claims, 3 Drawing Sheets

(51) Int. Cl.
   *G01R 31/36*   (2006.01)
   *H01M 10/625*  (2014.01)
   *H01M 10/615*  (2014.01)
   *H01M 10/6571* (2014.01)
   *H01M 10/0525* (2010.01)

(52) U.S. Cl.
   CPC ..... *H01M 10/4228* (2013.01); *H01M 10/615* (2015.04); *H01M 10/625* (2015.04); *H01M 10/6571* (2015.04); *H01M 10/0525* (2013.01); *H01M 2220/20* (2013.01); *Y02E 60/122* (2013.01)

(56) References Cited

U.S. PATENT DOCUMENTS

| | | | |
|---|---|---|---|
| 8,168,315 B1* | 5/2012 | Hermann | H01M 10/482 324/500 |
| 2001/0016278 A1* | 8/2001 | Onishi | H01M 6/5083 429/49 |
| 2003/0008204 A1 | 1/2003 | Winter et al. | |
| 2004/0134259 A1* | 7/2004 | Haug | G01M 3/363 73/40 |
| 2005/0081597 A1* | 4/2005 | Hoffmann | G01M 3/007 73/1.02 |
| 2006/0040177 A1 | 2/2006 | Onodera et al. | |
| 2012/0148890 A1* | 6/2012 | Goto | H01M 2/1077 429/90 |
| 2013/0314094 A1* | 11/2013 | Farmer | G01N 25/20 324/430 |
| 2013/0316198 A1* | 11/2013 | Bandhauer | H01M 10/502 429/50 |

FOREIGN PATENT DOCUMENTS

| | | |
|---|---|---|
| CN | 101047272 A | 10/2007 |
| DE | 19853631 | 6/1999 |
| DE | 10056972 | 5/2002 |
| EP | 1130668 | 9/2001 |
| EP | 1675210 | 6/2006 |

* cited by examiner

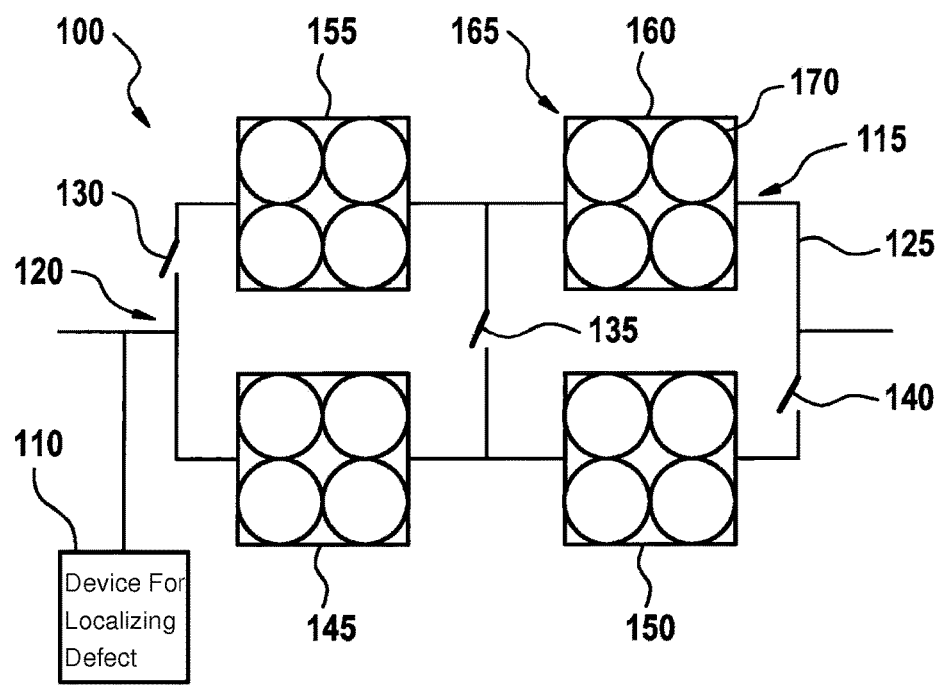
FIG. 1
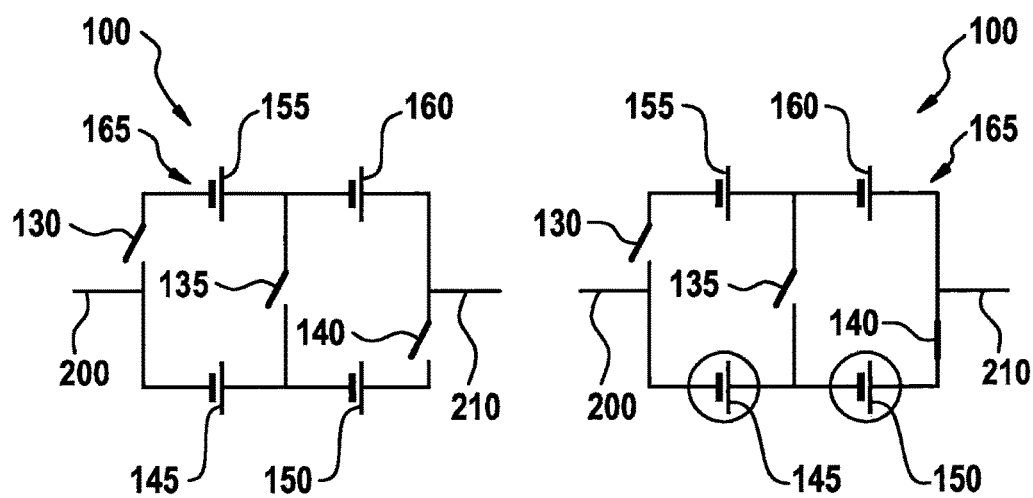
FIG. 2A  FIG. 2B

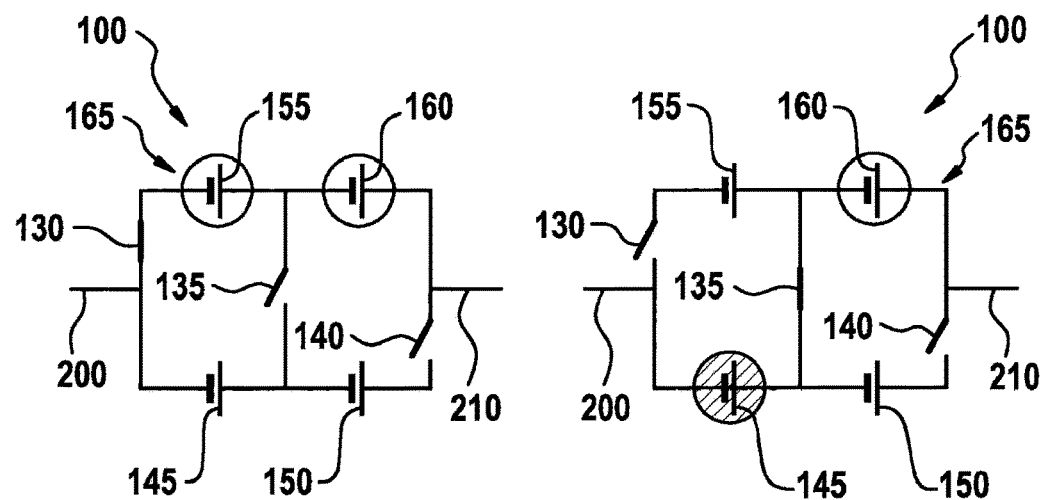
FIG. 2C  FIG. 2D
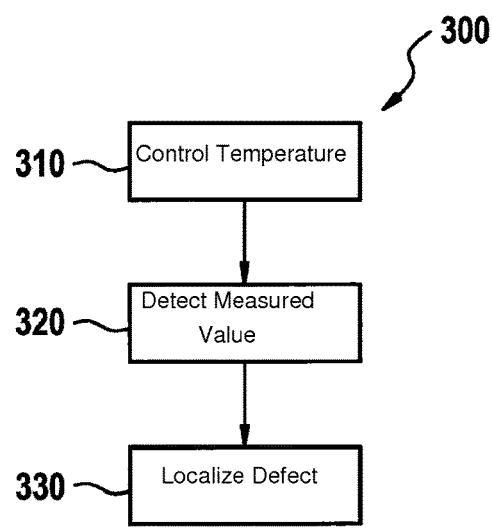
FIG. 3

METHOD AND DEVICE FOR LOCALIZING A DEFECT IN AN ELECTROCHEMICAL STORE AND DEFECT LOCALIZATION SYSTEM

FIELD OF THE INVENTION

The present invention relates to a method for localizing a defect in an electrochemical store, to a device for localizing a defect in an electrochemical store, to a corresponding defect localization system, and to a corresponding computer program product.

BACKGROUND INFORMATION

The significance of lithium-ion batteries as an electrochemical energy store has increased drastically over the past years. In addition to the use in portable devices such as laptops or mobile telephones, the focus lies in particular on the use in electric vehicles (EV). Depending on the design for a hybrid, a plug-in hybrid or an EV without an additional internal combustion engine, the capacity of present battery systems achieves values of approximately 1 kAh to 10 kAh. This corresponds to a stored energy of approximately 3 kWh to 40 kWh.

Reports about uncontrolled overheating, fires or explosions of rechargeable laptop batteries demonstrate the potential risks that this storage medium may pose. Due to the considerably higher amount of stored energy, batteries for EVs have a particularly high risk potential in the event of a defect.

However, reliable operation and high safety of lithium-ion batteries are indispensable for the comprehensive introduction in EVs.

SUMMARY

Against this background, the present invention introduces a method for localizing a defect in an electrochemical store, a device which uses this method, a defect localization system, and finally a corresponding computer program product.

Safety-critical damage to rechargeable batteries always manifests itself in cell components escaping from an electrochemical store, either due to a leaking cell housing—for example, due to a hairline crack—or due to opening of a cell as a result of internal overpressure—for example, due to a blow-out of a predetermined breaking point. If the damage is noticed in time, further damage is often preventable by targeted intervention. For example, a cell experiencing a loss of electrolyte due to a hairline crack will age more quickly than a cell having an intact housing since its internal resistance increases more strongly. This results in a higher temperature load of the damaged cell. The earlier the damage is reliably detected, the more moderate are the counter measures that must be initiated, for example, a replacement of a defective module during regularly scheduled maintenance.

The approach provided here allows a source of a leak in an electrochemical store which is detected with the aid of a sensor system, for example, to be clearly identified and localized.

The concept presented here is based on a deliberate temperature control of subareas of the electrochemical store to increase an internal pressure of the same. When a cell is defective, an increased or at least changed escape of cell components, typically electrolyte, occurs there, which is then detectable by the assigned sensor system. By correlating a sensor signal with the cell manipulation, it is possible to clearly identify the leaking cell, or a module including the defective cell, of the electrochemical store and to replace or repair it in the course of routine maintenance.

In this way, for example, advantageously a sensor system in the electrochemical store, or in the battery pack, which responds to a leaked constituent in the battery pack as a whole, may be suitably supported in that the defective cell or the defective module is clearly localizable.

The approach provided here allows the risk of a complete disaster after a cell defect to be limited, since it is possible to provide timely warning of a potential malfunction of the electrochemical store when using the detection system provided herein. In particular, the warning function may occur as early as possible, namely upon the first indication of an irregularity and considerably before overheating of the electrochemical store.

The present invention creates a method for localizing a defect in an electrochemical store, the method including the following steps:

controlling the temperature of a subarea of the electrochemical store to increase an internal pressure of the subarea;

detecting a measured value, which represents an escape of a component from the subarea occurring in response to the increased internal pressure of the subarea; and localizing the defect in the subarea when the measured value is in a predetermined relation to a comparison value.

The method may be carried out in connection with a device for localizing a defect in an electrochemical store, the device being installed in a vehicle, for example. The electrochemical store may be used to drive an electric vehicle or a hybrid vehicle and may be made up of multiple galvanic cells, which are combined to form a battery pack, for converting chemical into electrical energy. The defect may be a leak, for example, a hairline crack in a wall of a galvanic cell, or a breakage of a predetermined breaking point of the galvanic cell. The defect may cause cell constituents or components to escape from one or multiple of the galvanic cells, impairing the function of the electrochemical store. The component that has escaped from the galvanic cell(s) may be one constituent or constituents of an electrolyte situated within the galvanic cell, for example. The subarea of the electrochemical store may be only one galvanic cell, or a module formed by combining multiple galvanic cells, of the electrochemical store.

The temperature control may involve temperature control which concerns the subarea in a targeted manner, from which further subareas of the electrochemical store may be excluded. The temperature control may cause a temperature increase in the subarea which is sufficient to increase the internal pressure in the subarea so much that it is possible to reliably establish a component escape from a potential leak inside the subarea. As an alternative, the temperature control may also cause a temperature reduction in the subarea which is sufficient to decrease the internal pressure in the subarea so much that a component escape from a potential leak inside the subarea is reduced and hereby a change in the concentration of the component in the subarea is reduced or changed and thus becomes easily detectable. The internal pressure may be a pressure in the interior of a galvanic cell on a housing of the same. The escape of a component from the subarea is detectable with the aid of a sensor, for example, which may be situated in a flow path of a fluid, such as a cooling fluid, for example, flowing through the electrochemical store and containing the escaped component. The sensor may be situated inside or outside the electrochemical store and is able to detect the escaped component with the aid of a response to a chemical or physical property of the same. The measured value may represent a piece of information about the detection of the component, or also about a quantity of the detected escaped component, and is transmittable via an interface to the device for localizing a defect, for example. The step of localizing may be implemented, for example, by comparing the detected measured value to the comparison value to check whether or not the measured value is in the predetermined relation to the comparison value. The comparison value may be stored in the device, for example. A suitable algorithm may be used to carry out the comparison.

According to one specific embodiment, the method may include a step of controlling the temperature of at least one further subarea of the electrochemical store to change an internal pressure of the further subarea, a step of detecting at least one further measured value which represents an escape of a component from the further subarea occurring in response to the changed internal pressure of the further subarea, and a step of localizing the defect in the at least one further subarea when the at least one further measured value is in a predetermined relation to the comparison value. For example, the method may advantageously be used to successively analyze all subareas of the electrochemical store for defects in a simple manner.

The present invention further creates a device for localizing a defect in an electrochemical store, the device including the following features:

an interface for outputting a temperature control signal for controlling the temperature of a subarea and/or of at least one further subarea of the electrochemical store to change an internal pressure of the subarea and/or of the at least one further subarea in response to the temperature control signal;

an interface for reading in a measured value which represents an escape of a component from the subarea occurring in response to the changed internal pressure of the subarea and/or for reading in at least one further measured value which represents an escape of a component from the at least one further subarea occurring in response to the changed internal pressure of the at least one further subarea; and an interface for outputting a piece of localization information about a localization of the defect in the subarea when the measured value is in a predetermined relation to a comparison value, and/or a piece of localization information about a localization of the defect in the at least one further subarea when the at least one further measured value is in a predetermined relation to the comparison value.

The device may be designed to carry out or implement the steps of the method according to the present invention in corresponding devices.

The object of the present invention may also be achieved quickly and efficiently by this embodiment variant of the present invention in the form a device.

A device in the present invention may be understood to mean an electrical device which processes sensor signals and outputs control signals and/or data signals as a function thereof. The interfaces of the device may be designed as hardware and/or software. In the case of a hardware design, the interfaces may, for example, be part of a so-called system ASIC which includes a wide variety of functions of the device. However, it is also possible for the interfaces to be separate integrated circuits, or to be at least partially made up of discrete components. In the case of a software design, the interfaces may be software modules which are present on a microcontroller, for example, in addition to other software modules. The device here may be a control unit of a vehicle, for example.

The present invention further creates a defect localization system which includes the following features:
a device according to one of the preceding specific embodiments; and
a temperature control device for controlling the temperature of the subarea, or of the at least one further subarea, in response to the temperature control signal.

The defect localization system may, for example, be used in an electric or hybrid vehicle for controlling the function of a rechargeable drive battery of the vehicle. The temperature control device may be coupled to the subarea and/or to the at least one further subarea of the electrochemical store. The temperature control device may be designed to control the temperature of one or multiple galvanic cells of the subarea, or of the further subarea, passively from the outside, or actively by applying a load to the electrolyte situated within the cell housing.

According to one specific embodiment, the temperature control device may include an interconnecting device for interconnecting the subarea and the at least one further subarea of the electrochemical store in different interconnection states. In a first interconnection state, the subarea and the further subarea may be situated in a load path to which an electrical current may be applied, and in a second interconnection state, only the subarea may be situated in the load path to which an electrical current may be applied.

Moreover, in the second interconnection state, a third subarea of the electrochemical store may be situated in the load path to which an electrical current may be applied, and in a third interconnection state, a fourth subarea of the electrochemical store may be situated in the load path to which an electrical current may be applied.

According to these specific embodiments, the interconnecting device may include multiple electrical conductors and multiple switches, at least one galvanic cell of the subarea and/or of the further subarea and/or of the third subarea and/or of the fourth subarea of the electrochemical store in each case being electrically connectable to one of the electrical conductors. The electrical conductors and switches may be coupled to each other in such a way that different combinations of interrupted or established connections may be successively implemented between different subareas as a function of the selected interconnection state. An electric load may be applied to the subareas thus situated in a load path, or to a single subarea situated in a load path, to deliberately control the temperature of these subareas or the subarea and check it or them for a component escape. This specific embodiment offers the advantage that the different combinations of subareas of the electrochemical store basically allow an exclusion process in the search for a defect, so that a defective galvanic cell, or a defective cell module, is detectable particularly quickly and with low energy expenditure.

According to one further specific embodiment, the temperature control device may include a heating resistor and/or a cooling device assigned to the subarea of the electrochemical store, and/or at least one further heating resistor and/or one further cooling device assigned to the at least one further subarea of the electrochemical store. The temperature control device may be designed to apply an electric load to the heating resistor and/or to the cooling device, or to the at least one further heating resistor and/or to the further heating device, based on the temperature control signal. For example, the heating resistor or the further heating resistor and/or the cooling device or the further cooling device may be made of a material having high thermal conductivity and may surround a module, or a galvanic cell, of the electrochemical store which is assigned to the heating resistor or to the further heating resistor and/or to the cooling device or the further cooling device in the form of a jacket. The temperature control signal may be used to enable a flow of current in the heating resistor or the further heating resistor and/or in the cooling device or the further cooling device, so that the temperature of the same may be controlled and the same may transfer the heating or cooling energy to the corresponding cell housing. In this way, the internal pressure in the interior of the cell may be suitably increased from the outside with the aid of the temperature control. For example, the temperature control signal may initially be output for the subarea, and subsequently for the further subarea, and subsequently thereto for still following subareas, of the electrochemical store, so that the entire electrochemical store may thus be successively searched for defects.

As an alternative or in addition, the temperature control device may be coupled to a fluid channel for controlling the temperature of the subarea and/or to at least one further fluid channel for controlling the temperature of the at least one further subarea. The temperature control device may be designed to feed a temperature-controlled fluid to the fluid channel, or to the at least one further fluid channel, based on the temperature control signal. In this way, all subareas of the electrochemical store may also be consecutively tested for their functional state. This specific embodiment offers the advantage that it does not necessitate any additional elements since both the fluid channel and the at least one further fluid channel and also the fluid may be part of a cooling system for the electrochemical store which is already installed in the vehicle. The fluid may be heated with the aid of the engine waste heat, for example.

According to specific embodiments of the defect localization system, the subarea and/or the at least one further subarea of the electrochemical store may include a galvanic cell for converting chemical energy into electrical energy, or a combination of multiple galvanic cells for converting chemical energy into electrical energy. The combination of multiple galvanic cells may also be referred to as a module. The defect localization system may thus be adapted to customer specifications.

In addition, a computer program product is advantageous, having program code which may be stored on a machine-readable carrier such as a semiconductor memory, a hard disk memory or an optical memory, and which is used to carry out the method according to one of the specific embodiments described above, if the program product is executed on a computer or a device.

BRIEF DESCRIPTION OF THE DRAWINGS

FIG. 1 shows a schematic diagram of a defect localization system having an interconnecting device, according to one exemplary embodiment of the present invention.

FIGS. 2A through 2D show circuit diagrams of different interconnection states of the defect localization system from FIG. 1.

FIG. 3 shows a flow chart of a method for localizing a defect in an electrochemical store, according to one exemplary embodiment of the present invention.

DETAILED DESCRIPTION

Figure 4:
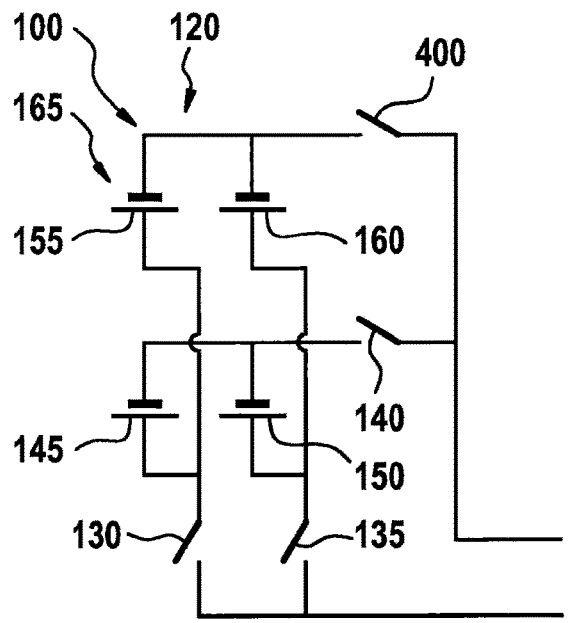
FIG. 4 shows a circuit diagram for a defect localization system having an interconnecting device, according to one further exemplary embodiment of the present invention.

In the following description of preferred exemplary embodiments of the present invention, identical or similar reference numerals are used for similarly acting elements shown in the different figures, and a repeated description of these elements is dispensed with.

To preferably minimize a safety-relevant risk from a defect of an electrochemical store, it is recommended to use a detection system which provides a timely warning of a potential malfunction. It is important that the warning function occurs as early as possible—i.e., considerably before overheating of the electrochemical store. For this purpose, the detection system may include a sensor system, for example, which is designed to detect a component escaping from the electrochemical store due to a defect of the same. Using such a sensor system allows such damage to be detected early, in particular if the defect is not detectable yet by other devices, such as the battery management system (BMS).

The concept presented herein makes it possible after detection of the escaped component to also locate its exact place of origin, i.e., the leak in question, in the electrochemical store. The corresponding module or the corresponding cell may then be replaced in a targeted manner, and a replacement of the entire electrochemical store is unnecessary.

FIG. 1 shows one exemplary embodiment of a defect localization system 100 based on a simplified schematic diagram. Defect localization system 100 is installed in a vehicle (not shown) in the shown exemplary embodiment and includes a device 110 for localizing a defect in an electrochemical store and a temperature control device 120 for controlling the temperature of a subarea or of at least one further subarea of the electrochemical store. The temperature control device may be designed as a heating device, for example, such as a heating resistor.

Device 110 is coupled to temperature control device 120, for example, via a CAN bus system of the vehicle. Device 110 is a control unit of the vehicle here. In the exemplary embodiment of defect localization system 100 shown in FIG. 1, temperature control device 120 is implemented as an interconnecting device. Interconnecting device 120 includes multiple electrical conductors 125 (of which only one is denoted by a reference numeral in the illustration for the sake of clarity) and a first switch 130, a second switch 135 and a third switch 140. Interconnecting device 120 is connected to an electrical consumer, which is not shown in the illustration in FIG. 1, and is connected via electrical conductors 125 to a first subarea 145, a second subarea 150, a third subarea 155, and a fourth subarea 160 of an electrochemical store 165. Subareas 145, 150, 155, 160 form modules of the electrochemical store or battery pack 165 here, which in each case include a combination of four galvanic cells 170, of which only one is denoted by a reference numeral for the sake of clarity. As is apparent from the illustration, modules 145 and 150 are connected in series, and modules 155 and 160 are connected in series. Module pair 145, 150 is connected in parallel with respect to module pair 155, 160. For clarity reasons, subareas or modules 145, 150, 155, 160 are shown spaced apart from each other. In reality, of course, they are closely combined to form battery pack 165, and battery pack 165 may also include more than four modules. As an alternative, subareas 145, 150, 155, 160 may also be formed by a single galvanic cell 170 in each case. However, this specific embodiment is not shown in the figures.

Defect localization system 100 shown in FIG. 1 is designed in such a way that a sufficiently high current may be applied to one of modules 145, 150, 155, 160 in a targeted manner when one or multiple switches 130, 135, 140 are opened or closed, the current ranging within the battery specifications, but providing for a notable heating/cooling of module 145, 150, 155, 160. This circumstance is addressed in greater detail based on the following FIGS. 2A through 2D. Typical discharge rates for this purpose according to the present related art are in the range from 3C to 5C for purely electrically operated vehicles (electric vehicles=EVs), in the range from 15C to 30C for hybrid vehicles, and between 3C and 30C for plug-in hybrid vehicles. A unit of 1C shall be understood to mean a current intensity which causes a fully charged battery or an electrochemical energy store to become completely discharged within one hour. A deliberate temperature control of at least one module 145, 150, 155, 160 is implementable with the aid of the different settable interconnection states of temperature control device 120. If one or multiple of subareas 145, 150, 155, 160 has or have a defective galvanic cell 170, the internal pressure of defective cell 170 increases due to the heating/cooling, resulting in an increased escape of cell components, typically electrolyte, which is then detectable by the sensor system (not shown in the illustration). The sensor system may be situated inside or outside battery pack 165, depending on the specification, and transmits a corresponding detection signal or measuring signal to device 110 coupled to the sensor system upon detecting an escaped component. There, the sensor signal is correlated with the module manipulation caused by the temperature control. The result of the correlation allows leaking cell 170 to be clearly identified and replaced or repaired in the course of routine maintenance.

FIGS. 2A through 2D show circuit diagrams of different interconnection states of defect localization system 100 from FIG. 1. As is clearly apparent from the circuit diagrams of FIGS. 2A through 2D, the interconnection of individual modules 145, 150, 155, 160 of battery pack 165 is preferably designed in such a way that a targeted load application to individual modules 145, 150, 155, 160 is possible upon appropriately opening or closing one or multiple of switches 130, 135, 140. Using a suitable test routine, which is to be described in greater detail by way of example based on the following circuit diagrams 2B through 2D, an application of a suitable load to modules 145, 150, 155, 160 in the shown switch combinations allows a defective unit 145, 150, 155 or 160 to be clearly identified. To better explain the inventive concept shown based on FIGS. 2A through 2D, it shall be assumed here by way of example that first module 145 is defective.

FIG. 2A shows a first interconnection state of defect localization system 100 at the beginning of a test routine for identifying a defective module 145, 150, 155, 160. First switch 130, second switch 135 and third switch 140 are opened, and no current flow takes place between a current feed line 200 to electrochemical store 165 and a current discharge line 210 out of electrochemical store 165. Accordingly, no electric load is applied to any of modules 145, 150, 155, 160.

FIG. 2B shows a second interconnection state of defect localization system 100. Here, third switch 140 is closed, and first switch 130 and second switch 135 remain open. By closing third switch 140, a load path is implemented from current feed line 200 to current discharge line 210 via first module 145 and second module 150. With the proviso that first module 145 is defective, a sensor system—which is not shown in illustrations 2A through 2D—detects an increased component escape, based on which it may be inferred that first module 145 or second module 150 is defective, or that both are defective.

FIG. 2C shows a third interconnection state of defect localization system 100. Here, first switch 130 is closed, and second switch 135 and third switch 140 are open. By closing first switch 130, a load path is implemented from current feed line 200 to current discharge line 210 via third module 155 and fourth module 160. With the proviso that neither third module 155 nor fourth module 160 is defective, the sensor system does not detect any increased component escape.

FIG. 2D shows a fourth interconnection state of defect localization system 100. Here, second switch 135 is closed, and first switch 130 and third switch 140 are open. By closing second switch 135, a load path is implemented from current feed line 200 to current discharge line 210 via first module 145 and fourth module 160. According to the proviso that first module 145 is defective, the sensor system detects an increased component escape here. Since it was ascertained with the interconnection state shown in FIG. 2C that neither third module 155 nor fourth module 160 is defective, a correlation of the result of the third interconnection state with the result of the fourth interconnection state allows first module 145 to be clearly identified as a defective module. To establish that in fact first module 145 alone is defective, and not that perhaps second module 150, for example, is also defective, modules 145, 150, 155, 160 should be interconnected, in which third module 155 and second module 150 are connected in series. If it is now established that no defect occurs in this interconnection, it is possible to infer from this that second module 150 is free of faults, so that the detected defect is in fact present in first module 145.

FIG. 3 shows a flow chart of one exemplary embodiment of a method 300 for localizing a defect in an electrochemical store. Method 300 includes the fundamental steps of the procedure for localizing a defective module in a battery pack described based on the interconnection states in FIGS. 2A through 2D, after an assigned sensor system has detected a leak in the battery pack.

In a step 310, the temperature of a subarea of the electrochemical store is controlled to increase an internal pressure of the subarea. The subarea may be, for example, a combination of two modules of a battery pack, which is made up of four modules, as is shown in the circuit diagrams from FIGS. 2A through 2D. According to the exemplary embodiment shown in FIGS. 2A through 2D, the temperature of the subarea is controllable by applying current to the modules assigned thereto with the aid of a suitable interconnection. As an alternative, the temperature of the subarea may also be passively controlled, for example, from the outside in step 310, such as with the aid of a heating resistor surrounding the module. Basically all temperature control methods which cause a suitable increase in the internal cell pressure are conceivable. If the subarea has a defect, for example, a leak of a cell housing in the subarea, in a step 320 a sensor system contacting the electrochemical store detects a measured value which represents an escape of a component from the subarea occurring in response to the increased internal pressure of the subarea. The defect may be localized in the subarea in a step 330 if a correlation of the measured value with a comparison value shows that the measured value is in a predetermined relation to the comparison value. Step 310 of the temperature control may be carried out with the aid of a temperature control device of a defect localization system coupled to the electrochemical store, as it is described based on FIG. 1, and step 330 of correlating may take place with the aid of a device 110 for localizing a defect in an electrochemical store of the defect localization system.

As an alternative, method 300 may be carried out in the same manner if the subarea represents a single galvanic cell of an electrochemical store.

By repeating steps 310, 320 and 330 for all subareas of the electrochemical store, it is thus possible to run a diagnostic program for identifying leaking modules or cells, the program successively controlling the temperature of all modules or cells, or advantageous combinations of the same, with the aid of the above-described method. At the same time, the signal of the sensor system is monitored for escaping cell constituents. A signal amplitude allows the inference of a leak in the temperature-controlled cell, in the temperature-controlled cells, or in the temperature-controlled module or the temperature-controlled modules. The diagnostic program may be integrated into an onboard battery management system (BMS) or implemented separately.

FIG. 4 shows a circuit diagram for a further exemplary embodiment of defect localization system 100 having an interconnecting device. Electrochemical storage 165 is again made up of first module 145, second module 150, third module 155, and fourth module 160. However, interconnecting device 120 is designed in such a way here that a parallel interconnection of four modules 145, 150, 155, 160 in a grid circuit results. First switch 130, second switch 135 and third switch 140 are supplemented by a fourth switch 400 here. Modules 145, 150, 155, 160 are interconnected in parallel in such a way here that first module 145, second module 150, third module 155 or fourth module 160 are individually addressable.

As was already explained above, the battery symbols shown in the circuit diagram of FIG. 4 may also represent single galvanic cells. The number of cells or modules interconnected in such a grid may be arbitrarily expanded; in general it applies that x+y switches are required for x*y modules or cells to be able to individually address each unit.

Figure 5:
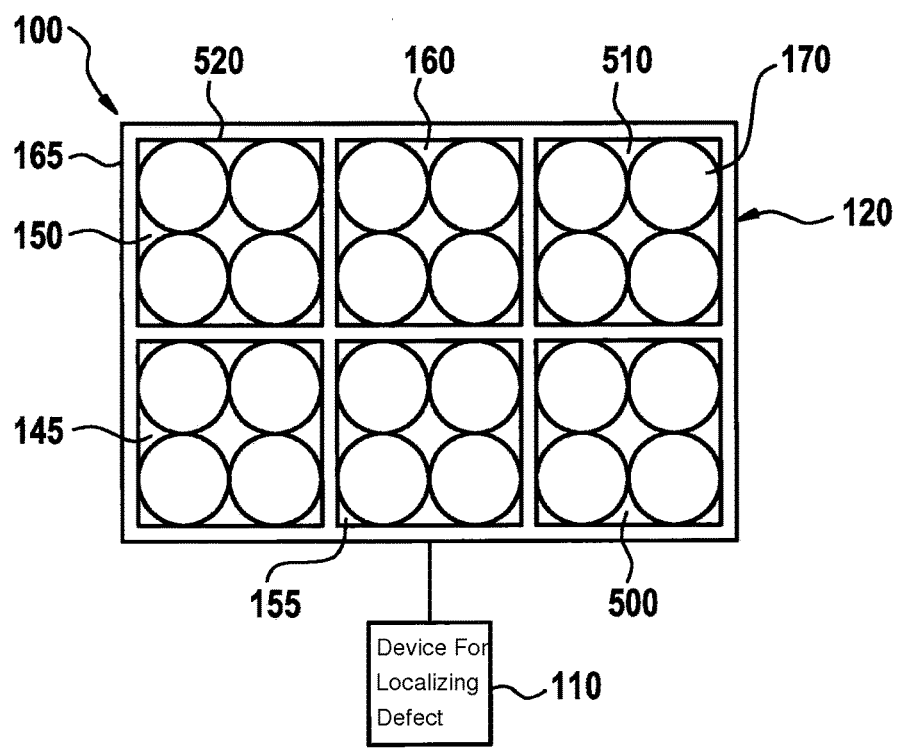
FIG. 5 shows a schematic diagram of a defect localization system having a heating resistor, according to one exemplary embodiment of the present invention.

Based on a schematic diagram, FIG. 5 shows a further exemplary embodiment of a defect localization system 100, which here as well is used to localize a defect in electrochemical store 165. Defect localization system 100 once again is made up of device 110 for localizing a defect in an electrochemical store, and temperature control device 120 for controlling the temperature of a subarea, or of at least one further subarea, of the electrochemical store. In addition to first module 145, second module 150, third module 155 and fourth module 160, electrochemical store 165 includes a fifth module 500 and a sixth module 510, which are also formed by four galvanic cells 170 in each case. Contrary to the exemplary embodiments described further above, however, temperature control device 120 is formed by heating resistors, which are situated in sheathings 520 of individual modules 145, 150, 155, 160, 500, 510 not visible to the eye. In this way, targeted passive temperature control of each individual module 145, 150, 155, 160, 500, 510 from the outside is achievable by deliberately acting on the heating resistors suitably enclosing each module 145, 150, 155, 160, 500, 510. The above-explained diagnostic method for identifying defective cells in a battery pack may also be suitably carried out in this way.

Instead of modules 145, 150, 155, 160, 500, 510 including multiple galvanic cells 170, as shown in the illustration, galvanic cells 170 themselves may also be configured with a heating resistor and may be individually controlled accordingly in terms of their temperature and analyzed for defects.

A further option for identifying defective subareas of an electrochemical store is the use of a cooling system of the battery pack. When suitably conducting a cooling medium, which is typically a gas—for example, air—or a liquid, the temperature of individual areas of the battery pack, for example, individual cells or modules, is controllable in a targeted manner by utilizing the engine waste heat, for example, or by actively heating the cooling medium. However, this possible exemplary embodiment is not shown in the figures.

The described exemplary embodiments shown in the figures are selected only by way of example. Different exemplary embodiments may be combined with each other completely or with respect to individual features. It is also possible to supplement one exemplary embodiment with features of another exemplary embodiment.

Moreover, method steps according to the present invention may be carried out repeatedly and in a different order than the one described.

If one exemplary embodiment includes an "and/or" link between a first feature and a second feature, this should be read in such a way that the exemplary embodiment according to one specific embodiment includes both the first feature and the second feature, and according to an additional specific embodiment includes either only the first feature or only the second feature.

What is claimed is:

1. A method for localizing a defect in an electrochemical store, the method comprising:
controlling a temperature of a subarea of the electrochemical store to increase an internal pressure of the subarea, wherein the controlling of the temperature of the subarea is performed in a targeted manner, such that at least one further subarea of the electrochemical store is excluded;
detecting a measured value representing an escape of a component from the subarea occurring in response to the increased internal pressure of the subarea; and
localizing the defect in the subarea when the measured value is in a predetermined relation to a comparison value.

2. A defect localization system, comprising:
a device for localizing a defect in an electrochemical store, the device including:
an interface for outputting a temperature control signal for controlling a temperature of at least one of a subarea and at least one further subarea of the electrochemical store to increase an internal pressure of the at least one of the subarea and the at least one further subarea in response to the temperature control signal;
an interface for at least one of:
reading in a measured value representing an escape of a component from the subarea occurring in response to the increased internal pressure of the subarea, and
reading in at least one further measured value representing an escape of a component from the at least one further subarea occurring in response to the increased internal pressure of the at least one further subarea, and an interface for outputting at least one of:

a piece of localization information about a localization of the defect in the subarea when the measured value is in a predetermined relation to a comparison value, and a piece of localization information about a localization of the defect in the at least one further subarea when the at least one further measured value is in a predetermined relation to the comparison value; and a temperature control device for controlling one of the temperature of the subarea and the at least one further subarea in response to the temperature control signal, wherein the temperature control device includes an interconnecting device for interconnecting the subarea and the at least one further subarea of the electrochemical store in different interconnection states, wherein in a first interconnection state the subarea and the further subarea are situated in a load path to which an electrical current is appliable, and wherein in a second interconnection state only the subarea is situated in the load path to which the electrical current is applicable.

3. The defect localization system as recited in claim 2, wherein, in the second interconnection state, a third subarea of the electrochemical store is situated in the load path to which the electrical current is appliable.

4. The defect localization system as recited in claim 3, wherein, in a third interconnection state, a fourth subarea of the electrochemical store is situated in the load path to which the electrical current is appliable.

* * * * *